(12) United States Patent
Behammer

(10) Patent No.: US 7,059,041 B2
(45) Date of Patent: Jun. 13, 2006

(54) METHODS FOR PRODUCING PASSIVE COMPONENTS ON A SEMICONDUCTOR SUBSTRATE

(75) Inventor: Dag Behammer, Ulm (DE)

(73) Assignee: United Monolithic Semiconductors GmbH, Ulm (DE)

( * ) Notice: Subject to any disclaimer, the term of this patent is extended or adjusted under 35 U.S.C. 154(b) by 468 days.

(21) Appl. No.: 10/344,653

(22) PCT Filed: Aug. 1, 2001

(86) PCT No.: PCT/DE01/02925

§ 371 (c)(1),
(2), (4) Date: Feb. 13, 2003

(87) PCT Pub. No.: WO02/15273

PCT Pub. Date: Feb. 21, 2002

(65) Prior Publication Data

(30) Foreign Application Priority Data

Aug. 14, 2000 (DE) .................. 100 39 710

(51) Int. Cl.
*H05K 3/30* (2006.01)
(52) U.S. Cl. ............... 29/832; 29/825; 29/846; 438/384
(58) Field of Classification Search ........... 29/825, 29/848, 846; 438/384
See application file for complete search history.

(56) References Cited

U.S. PATENT DOCUMENTS

| 3,430,334 | A | * | 3/1969 | Kikuo et al. ................ 438/384 |
| 3,607,679 | A | * | 9/1971 | Melroy et al. .............. 205/125 |
| 3,616,282 | A | * | 10/1971 | Bodway ..................... 205/122 |
| 3,649,945 | A | * | 3/1972 | Waits ......................... 338/309 |
| 3,718,565 | A | * | 2/1973 | Pelletier ................ 204/192.21 |
| 3,778,689 | A | | 12/1973 | Bodway |
| 3,949,275 | A | * | 4/1976 | Muenz ....................... 361/766 |
| 3,988,824 | A | * | 11/1976 | Bodway ...................... 216/16 |
| 3,997,411 | A | * | 12/1976 | Muenz ....................... 205/125 |
| 4,251,326 | A | * | 2/1981 | Arcidiacono et al. .......... 216/6 |
| 4,344,223 | A | * | 8/1982 | Bulger et al. ............... 438/384 |
| 4,878,770 | A | | 11/1989 | Ruggierio et al. |
| 5,514,612 | A | * | 5/1996 | Rao et al. ................... 438/382 |
| 5,618,749 | A | * | 4/1997 | Takahashi et al. .......... 438/384 |
| 6,445,027 | B1 | * | 9/2002 | Adachi ....................... 257/300 |

FOREIGN PATENT DOCUMENTS

| DE | 20 44 255 | | 3/1972 |
| DE | 195 31 629 | | 1/1997 |
| JP | 61-129853 | * | 6/1986 |
| JP | 03-012960 | * | 1/1991 |
| WO | WO 96 27210 | | 9/1996 |

* cited by examiner

*Primary Examiner*—Carl J. Arbes
(74) *Attorney, Agent, or Firm*—Collard & Roe, P.C.

(57) ABSTRACT

Methods are specified for producing passive components on a substrate, which methods permit, with a low outlay and a good yield, the production of different components, in particular high-resistance and low-resistance resistor elements and/or capacitor elements having a higher and those having a lower capacitance per unit length on a substrate. In this case, lift-off processes can largely be dispensed with, particularly in the case of critical patternings, and selective dry- and/or wet-chemical etching can be effected.

13 Claims, 4 Drawing Sheets

METHODS FOR PRODUCING PASSIVE COMPONENTS ON A SEMICONDUCTOR SUBSTRATE

CROSS REFERENCE TO RELATED APPLICATIONS

Figure 1:
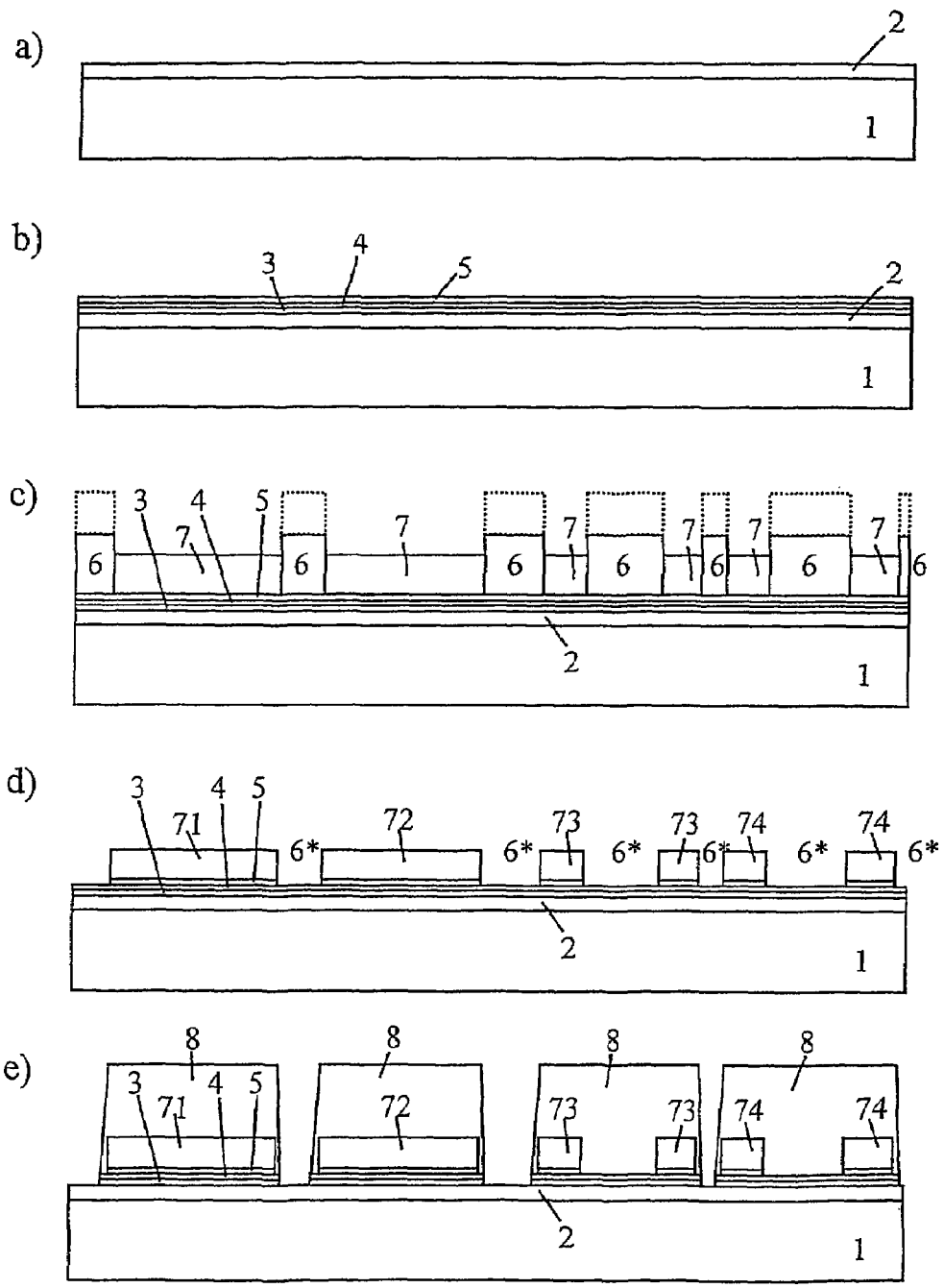
Figure 1:
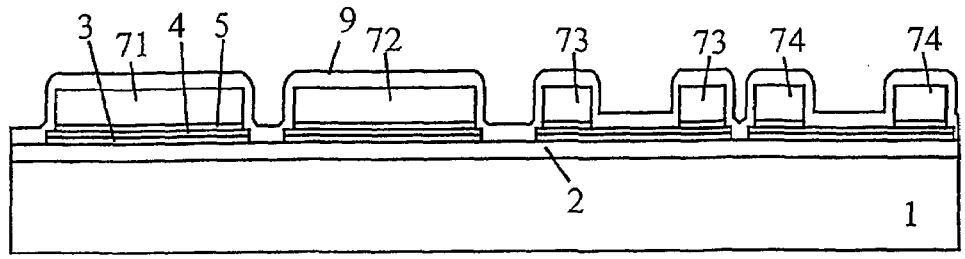
Figure 1:
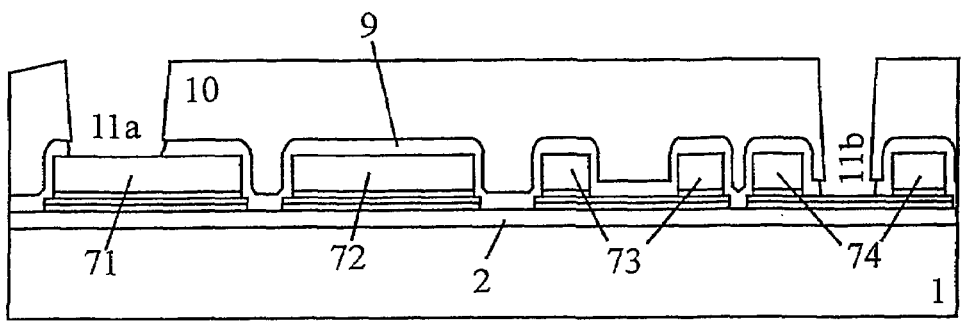
Figure 1:
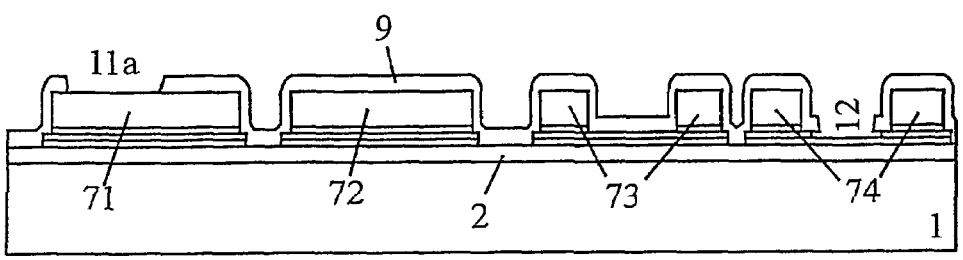
Figure 1:
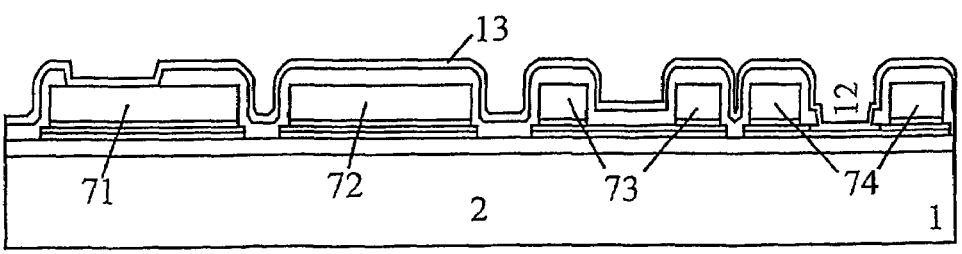
Figure 1:
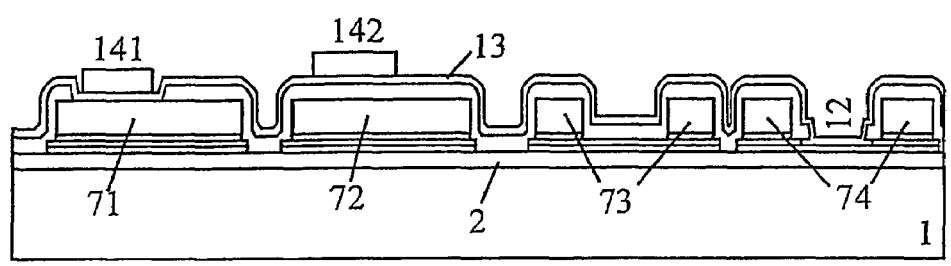
Figure 1:
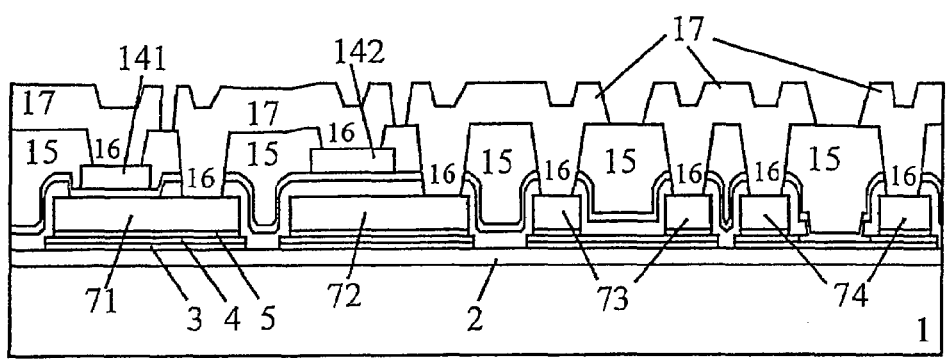

Applicant claims priority under 35 U.S.C. §119 of German Application No. 100 39 710.7, filed: Aug. 14, 2000. Applicants also claims priority under 35 U.S.C. §365 of PCT/DE01/02925, filed: Aug. 1, 2001. The international application under PCT article 21(2) was not published in English.

The invention relates to a method for producing passive components in particular thin-film resistor elements and/or capacitor elements on a semiconductor substrate.

During the production of monolithic integrated semiconductor circuits, it is advantageously possible for passive components in particular resistors and/or capacitors, also to be produced in addition to active semiconductor components (HBT, FET, . . . ) on the same substrate and to be connected to one another and to the active components to form complex circuits. The resistors are typically produced as thin-film resistors, and the capacitors as MIM (metal-insulator-metal) film capacitors.

Whereas in silicon-based technologies the layers or regions used for the active components can also be used at the same time to produce the passive components, in compound semiconductors the formation of the passive components typically necessitates the deposition of further layers on the substrate surface, which has usually been passivated beforehand. In this case, although it is possible to produce components with high accuracy, good reproducibility and adjustable properties over wide ranges, the generally high complexity of the production processes and the associated costs are disadvantageous. The lift-off processes that are often used lead to unsatisfactory yields.

U.S. Pat. No. 3,996,551 describes the production of high-resistance and low-resistance resistors on an insulating substrate, a first mask being used in a lift-off process to deposit a patterned double layer comprising high-resistance resistor material on the substrate and a low-resistance resistor material in the overlying layer. Partial removal of the low-resistance layer using a further mask creates high-resistance resistor regions, which are covered by a passivation layer. Contact cartridges to the low-resistance layer and metallic contacts are produced in the passivation layer by means of further masks.

U.S. Pat. No. 4,878,770 describes the self-aligning production of precise thin-film resistors in a high-resistance resistor layer which is deposited on a substrate and above which a contact layer and, if required, a barrier layer as diffusion barrier between contact layer and resistor layer are applied over the whole area. The entire layer sequence is etched as far as the substrate using a first mask uniformly in order to define resistor geometries. In a further step, central regions between contact regions are etched selectively as far as the resistor layer by means of a second mask in the multilayer resistor geometries.

WO 96/27210 discloses inter alia a method for producing resistors and capacitors in which a double layer comprising a resistor layer and a contact layer is deposited onto a substrate. In the double layer, component regions for resistors and capacitors are separated, within which resistors are formed in a subsequent step by removal of the contact layer. This first component plane is covered with an insulator layer in which contact holes are uncovered. A conductor layer deposited thereon is patterned in order to form terminal contacts to the contact layer and from the capacitor areas thereof.

The invention is based on the object of specifying a method for producing passive components on a semiconductor substrate by means of which different passive components can be produced with a low outlay.

Solutions according to the invention are described in the independent claims. The dependent claims contain advantageous refinements and developments of the invention.

The use of a common mask to produce structures for capacitors and resistors in the first insulator layer results in a procedure that has a low level of complexity and is thus cost-effective. In this case, the first insulator layer lies above the contact layer as lower metallization plane for MIM capacitors in the case of the capacitor structures and above a resistor layer in the case of the resistor structures. The first insulator layer is then removed selectively both with respect to the contact layer and with respect to the resistor layer.

In this case, in accordance with one development, the invention makes it possible, in a particularly simple and advantageous manner, to produce both different groups of capacitor elements distinguished by the capacitance per unit length, i.e. the capacitance related to area, and different groups of resistor elements.

By selective removal of the second, upper low-resistance resistor layer in the structure produced in the first insulator layer as far as the first, lower high-resistance resistor layer, it is possible to produce a high-resistance resistor element, in which case, by combining the mask for the separation of the components and the mask for the production of the structure in the first insulator layer, it is possible to produce, in a self-aligning manner, resistor elements with high geometrical precision in a manner similar to the procedure disclosed in U.S. Pat. No. 4,878,770. A second insulator layer that is subsequently deposited may advantageously comprise a material which acts as corrosion protection for the resistor layer.

In the structures in the first insulator layer which are produced for first capacitor elements above bottom capacitor electrodes of the contact layer, it is possible to deposit a second insulator layer whose properties can be designed for a high capacitance per unit length according to material and layer thickness. In particular, the material of the second insulator layer can have a relatively high dielectric constant. By virtue of the preferred whole-area deposition of the second insulator layer, an insulator double layer is produced outside the structures that are uncovered in the first insulator layer. By virtue of metal areas deposited on the second insulator layer as top capacitor electrodes of MIM capacitors, it is then possible to produce first capacitor elements having a high capacitance per unit length with only the second insulator layer as dielectric or second capacitor elements having a lower capacitance per unit length with the insulator double layer as dielectric by means of a common mask.

The production of capacitors having a different capacitance per unit length in this way is also particularly advantageous independently of the simultaneous production of capacitor structures and resistor structures by means of a common mask.

In the production of thin-film resistor elements by successive deposition of a first resistor layer, a second resistor layer and a contact layer, as a material which serves, on the one hand, as diffusion barrier between the contact layer and a material lying below the barrier layer and, on the other hand, simultaneously as resistor material is advantageously chosen for at least one of the resistor layers, and at least one resistor element is also produced in the barrier later, preferably at least one resistor element is in each case produced in each of the two resistor layers. The second resistor layer is preferably formed as a low-resistance barrier layer. The barrier layer is advantageous particularly by virtue of the fact that the layer sequence of first resistor layer, second resistor layer and contact layer can also be deposited on contact windows opened in the passivation layer above active components, without impairments of the active semiconductor component occurring due to diffusion between contact layer deposited above the contact windows and an active semiconductor region. The current flow to the active semiconductor region takes place with low resistance perpendicular to the resistor layers.

The production method according to the invention can dispense with lift-off processes entirely or to the greatest possible extent and can advantageously largely use dry- or wet-chemical etching methods to form structures in a layer, it being possible to use, in particular, etchants which act selectively on individual layer materials and automatically stop the etching process at the underlying layer.

The invention is illustrated in still greater detail below using an example of the production of a complex band element arrangement with high-resistance and low-resistance resistor elements and MIM capacitor elements having different capacitances per unit length, with reference to the figures. The successive situations of a first advantageous embodiment of a production process are designated in FIG. 1 with FIG. a to k. Advantageous variants of the introductory steps of the production process are described using FIG. 2, FIGS. a to d.

After the active components (not included in the figures) have been integrated in the substrate 1, the surface of the substrate and of the active components is passivated by a dielectric 2 (FIG. 1,a). On the active components, contact windows are opened in the passivation layer and, under certain circumstances, a thin layer of a metal is applied.

A first resistor layer 3 made of high-resistance resistor material, preferably $WSi_xN_y$, a second resistor layer 4 made of lower-resistance resistor material by comparison therewith, and a metal layer 5 are successively deposited onto the passivated substrate (including active components) over the whole area (FIG. 1,b). The second resistor layer may comprise, in particular, $(WTi)N_z$ and simultaneously forms a diffusion barrier between the metal layer 5 and the first resistor layer 3 or the active semiconductor material or a layer—situated thereon—of a different metal in a contact window. In the resistor layers 3 and 4, it is advantageously possible, in each case for the materials specified by way of example, to influence the sheet resistance and/or the temperature coefficient of the resistor material by way of the nitrogen content. The metal layer 5 may be composed of gold, for example. The layers 3, 4 and 5 may advantageously be applied in one process operation, in particular by sputtering.

A first photoresist layer 6 is applied to the metal layer 5, and electrode regions are uncovered in said photoresist layer. In the uncovered electrode regions, the metal layer is reinforced by a thicker contact metallization 7, for example by electrodeposition or by vapor deposition of a metal which preferably has a composition identical or similar to that of the metal layer 5 (FIG. c). Contact metal deposited on the photoresist layer 6 during vapor deposition is removed by stripping away the residual photoresist in a lift-off method. The conductive double layer shall be designated as contact layer and forms a first electrode plane. In a favorable embodiment, the metal layer 5 may also comprise a layer sequence of titanium on gold. In this case, the titanium layer improves the adhesion properties of the photoresist 6 that is subsequently applied. The titanium layer is patterned wet-chemically after the patterning of the photoresist before the contact metallization 7 is applied.

The layer 5 can be dispensed with in the case of vapor deposition of the layer 7. A sputtering etching process directly before the vapor deposition of the layer 7 onto the layer 4 can minimize the contact resistance between the layers 7 and 4.

After the removal of the photoresist mask 6, the thin metal layer 5 in the gaps 6* between the electrodes 7 of the contact metallization is removed wet-chemically selectively with respect to the layer 4 (FIG. d) and electrodes are produced on the second resistor layer, which electrodes may be provided for example as bottom electrodes 71, 72 for MIM capacitor elements or as terminal electrodes 73, 74 for thin-film resistors.

In a further photoresist mask 8, the contours of different components and possibly of connecting lines in the electrode plane of the layer 7 are patterned and the different components are separated by selective etching of the resistor layers 3 and 4 as far as the passivation layer 2 (FIG. e).

After the second photoresist mask 8 has been stripped away, a first insulator layer 9 is applied over the whole area (FIG. f) and covered with a further photoresist layer 10. By means of the photoresist layer 10, an opening 11a above the capacitor electrode 71 and a further opening 11b above the second resistor layer 4 between the terminal electrodes 74 are etched free in the first insulator layer (FIG. g). The etching operation stops automatically at the electrode layer 7 and the second resistor layer 4, respectively. The opening 11b uncovered in the first insulator layer 9 serves as a mask for the selective etching of an opening 12 in the second resistor layer 4 with respect to the first resistor layer 3. As a result, a high-resistance thin-film resistor element is produced between the terminal electrodes 74, the properties of which element are critically determined by the first resistor layer 3, whereas a low-resistance resistor element is formed between the terminal electrodes 73, the properties of which element are primarily given by the material of the second resistor layer 4 (FIG. h).

A second insulator layer 13 is deposited (FIG. i) over the whole area of the arrangement outlined in FIG. h, which insulator layer serves, in the opening 11a above the electrode 71, as dielectric for first MIM capacitors having a high capacitance per unit length and, advantageously in the opening 12, as corrosion protection for the first resistor layer 3 that is uncovered there. At the same time, a thicker insulator double layer 9+13 is produced by virtue of the second insulator layer above the electrode 72, and serves as dielectric for second MIM capacitor elements with a lower capacitance per unit length than in the case of the first MIM capacitor elements.

The top electrodes 141 and 142 (FIG. j) produced on the second insulator layer in a common process step form, with the bottom electrodes 71 and 72, respectively, the above-mentioned capacitor elements having a higher capacitance per unit length (71/141) and, respectively, lower capacitance per unit length (72/142), the values of the capacitances per unit length being adjustable through the layer thicknesses and material properties of the insulator layers 9 and 13. The insulator layers 9, 13 can be constructed from identical or different materials. In particular, a material having a lower dielectric constant may be advantageous for the first insulator layer 9 and a material having a higher dielectric constant may be advantageous for the second insulator layer 13, thereby amplifying the differences in the capacitances per unit length which are already prescribed by the different layer thicknesses. Capacitor elements having a high capacitance per unit length are particularly suitable for example for capacitor elements having a high quality factor in RF circuits, while the capacitor elements having a lower capacitance per unit length by virtue of the thicker insulator double layer may advantageously serve for DC isolation.

The component structures according to FIG. j can be planarized, in a manner that is customary per se, by means of a dielectric 15 (e.g. BCB) and, after contact holes 16 have been opened, can be contact-connected via a further patterned metallization 17 (FIG. k).

The metal layer 5 applied in step b of FIG. 1 serves, in particular, as a conductive start layer for the electrodeposition of the reinforcement metallization 7. In the case of vapor deposition of the metallization 7, the layer 5 as conductor plane can therefore also be obviated.

Figure 2:
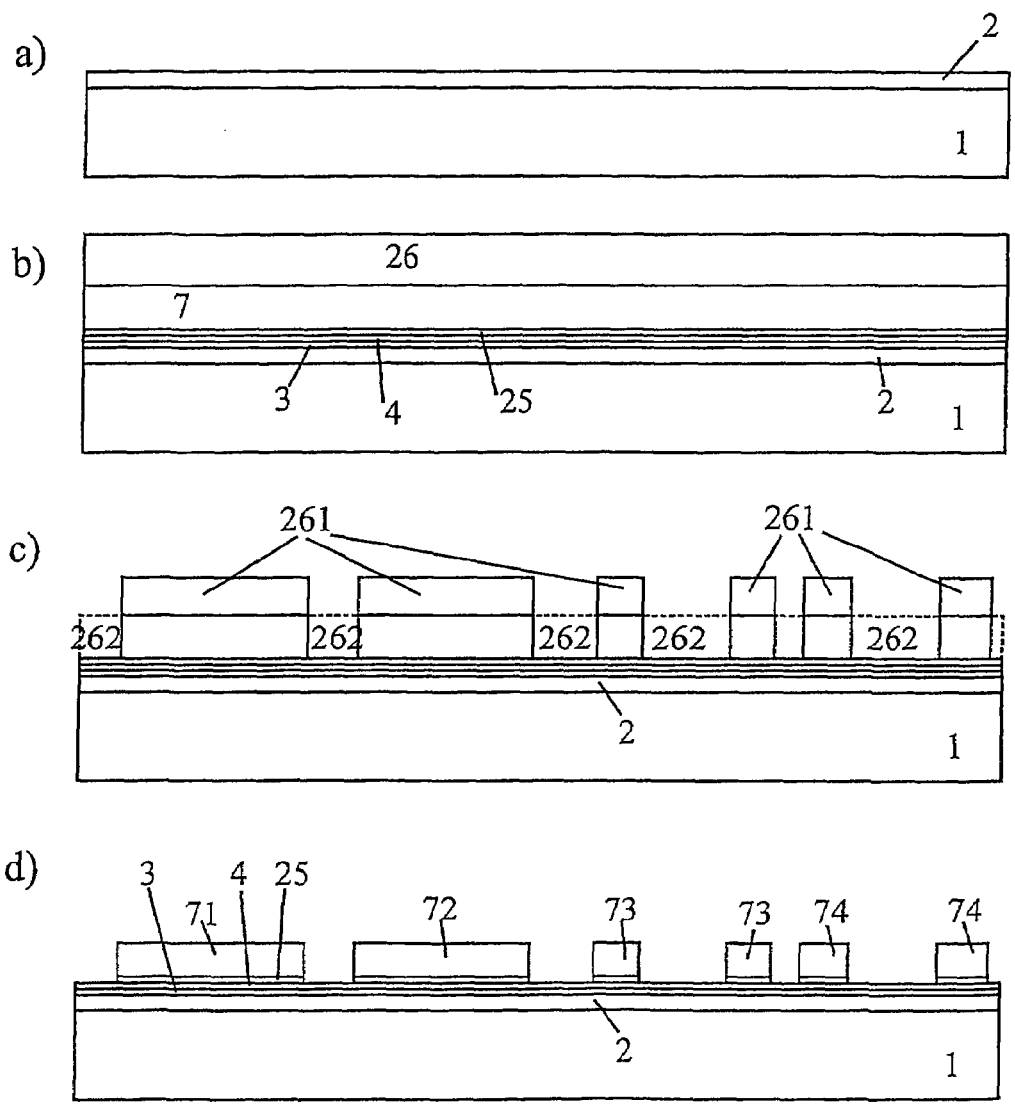

In the procedure outlined in FIG. 2, the substrate 1 is again passivated by a dielectric 2 (FIG. 2,a). A first resistor layer 3, a second resistor layer 4, a conductor layer 25, a contact metallization 7 and a photoresist layer 26 are successively applied to the passivated substrate over the whole area (FIG. 2,b). By patterning the photoresist layer 26 with covered electrode regions 261 as etching mask for the layer 7, the structures 71, 72, 73, 74 are produced in the layer 7 (FIG. 2,c), the conductor layer 25 acting as an etching stop layer. In the uncovered regions 262, the layer 25 is subsequently removed selectively with respect to the layer 4 (FIG. 2,d). The further steps of the production process correspond to the steps explained with reference to FIG. 1, FIGS. e to k.

If the layer 7 can be etched selectively with respect to the second resistor layer 4, the layer 5 can also be dispensed with. However, the layer 5 may possibly also serve as an adhesion promoter, diffusion barrier, etc.

The features above and the features which are specified in the claims and the features which can be gathered from the figures can advantageously be realized both individual and in different combinations. The invention is not restricted to the examples described, but rather can be modified in various ways within the scope of expert ability.

The invention claimed is:

1. A method for producing at least one thin-film resistor element and at least one capacitor element on a substrate, comprising
    1a) successively depositing on the substrate (2), which is passivated, if appropriate, a first high-resistance resistor layer (3), on the latter a second low-resistance resistor layer (4) and on the latter a contact layer (5, 7), which is provided for electrodes and terminals,
    1b) producing structures (71, 72, 73, 74) for terminals and bottom electrodes in the contact layer (5, 7),
    1c) separating components by isolating regions being etched free,
    1d) applying a first insulator layer (9) over the whole area on the contact layer (5, 7) patterned according to 1b) and the resistor layer (4),
    1e) producing structures (11a) for first capacitors in the form of openings in the first insulator layer (9) above bottom electrodes produced according to 1b),
    1f) depositing a second insulator layer (13) over the whole area on the structures (11a) produced in 1e), and
    1g) producing top electrodes (141, 142) for capacitor elements in a metallization layer lying above the second insulator layer (13).

2. The method as claimed in claim 1, wherein structures (11b) for first resistors are produced together with the production of the structures (11a) in the first insulator layer for first capacitor elements by means of a common mask.

3. The method as claimed in claim 1, wherein the second insulator layer is deposited over the whole area.

4. The method as claimed in claim 1, wherein a material which effects corrosion protection for the underlying resistor layer (3) is chosen for the second insulator layer (13).

5. The method as claimed in claim 1, wherein the structures (71, 72, 73, 74) of the contact layer (5, 7) are produced as a conductor plane (5) deposited over the whole area with patterned thicker contact metallization as reinforcement metallization (7) and removal of non-reinforced conductor areas of the conductor plane (5).

6. The method as claimed in claim 1, wherein the contact layer (5, 7) is deposited over the whole area and then removed in patterned fashion in order to produce the structures (71, 72, 73, 74).

7. The method as claimed in claim 1, wherein the structures (71, 72, 73, 74) are produced by patterned deposition of a contact metallization (7) on the second resistor layer (4).

8. The method as claimed in claim 1, wherein high-resistance resistors are produced by removal of the low-resistance resistor layer (4) in separated resistor components with the structures (11b) for the first resistors in the first insulator layer.

9. The method as claimed in claim 1, wherein top electrodes (141) for first capacitor elements of higher specific capacitance are produced above bottom electrodes (71) which are uncovered in 1e and covered with the second insulator layer (13).

10. The method as claimed in claim 1, wherein top capacitor electrodes (142) for second capacitor elements of lower specific capacitance are produced above bottom capacitor electrodes (72) which are not uncovered in 1e and are covered with the first and second insulator layers.

11. The method as claimed in claim 1, wherein a material with a higher dielectric constant is chosen for the second insulator layer (13) than for the first insulator layer (9).

12. A method for producing at least one thin-film resistor element and at least one capacitor element on a substrate, comprising
    1a) successively depositing on the substrate (2), which is passivated, if appropriate, a first high-resistance resistor layer (3), on the latter a second low-resistance resistor layer (4) and on the latter a contact layer (5, 7), which is provided for electrodes and terminals,
    1b) producing structures (71, 72, 73, 74) for terminals and bottom electrodes in the contact layer (5, 7),
    1c) separating components by isolating regions being etched free,
    1d) applying a first insulator layer (9) over the whole area on the contact layer (5, 7) patterned according to 1b) and the resistor layer (4),
    1e) producing structures (11a) for first capacitors in the form of openings in the first insulator layer (9) above bottom electrodes produced according to 1b),
    1f) depositing a second insulator layer (13) over the whole area on the structures (11a) produced in 1e), and 1g) producing top electrodes (141, 142) for capacitor elements in a metallization layer lying above the second insulator layer (13); and wherein top electrodes (141) for first capacitor elements of higher specific capacitance are produced above bottom electrodes (71) which are uncovered in 1e and covered with the second insulator layer (13); and wherein top capacitor electrodes (142) for second capacitor elements of lower specific capacitance are produced above bottom capacitor electrodes (72) which are not uncovered in 1e and are covered with the first and second insulator layers.

13. A method for producing at least one thin-film resistor element and at least one capacitor element on a substrate, comprising 1a) successively depositing on the substrate (2), which is passivated, if appropriate, on the latter a contact layer (5, 7), which is provided for electrodes and terminals, 1b) producing structures (71, 72, 73, 74) for terminals and bottom electrodes in the contact layer (5, 7), 1c) separating components by isolating regions being etched free, 1d) applying a first insulator layer (9) over the whole area on the contact layer (5, 7) patterned according to 1b), 1e) producing structures (11*a*) for first capacitors in the form of openings in the first insulator layer (9) above bottom electrodes produced according to 1b), 1f) depositing a second insulator layer (13) over the whole area on the structures (11*a*) produced in 1e), and 1g) producing top electrodes (141, 142) for capacitor elements in a metallization layer lying above the second insulator layer (13).

* * * * *